(12) United States Patent
Liddell et al.

(10) Patent No.: US 8,640,064 B1
(45) Date of Patent: Jan. 28, 2014

(54) HARDWARE DESCRIPTION LANGUAGE SIMULATOR TRACING AND CONTROL

(75) Inventors: David K. Liddell, Longmont, CO (US); Roger Ng, Campbell, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 13/494,807

(22) Filed: Jun. 12, 2012

(51) Int. Cl.
*G06F 17/50* (2006.01)

(52) U.S. Cl.
USPC .......................................... 716/106; 716/104

(58) Field of Classification Search
USPC ................................. 716/106–109
See application file for complete search history.

(56) References Cited

U.S. PATENT DOCUMENTS

| 7,882,462 B2 * | 2/2011 | Ogilvie et al. ................. 716/103 |
| 7,882,473 B2 * | 2/2011 | Baumgartner et al. ....... 716/106 |
| 2005/0198606 A1 * | 9/2005 | Gupta et al. .................... 716/18 |

\* cited by examiner

*Primary Examiner* — Binh C. Tat
(74) *Attorney, Agent, or Firm* — Kevin T. Cuenot

(57) ABSTRACT

Processing a circuit design specified in a hardware description language (HDL) can include, for each of a plurality of nets of the circuit design, creating a trace memory structure, using a processor, during compilation of the HDL circuit design. Each trace memory structure can include trace properties indicating whether tracing is active for the net. A transaction function can be generated during compilation for each net. The transaction function can be configured to invoke tracing for each net during simulation of the circuit design according to an evaluation of the trace properties for the net.

5 Claims, 7 Drawing Sheets

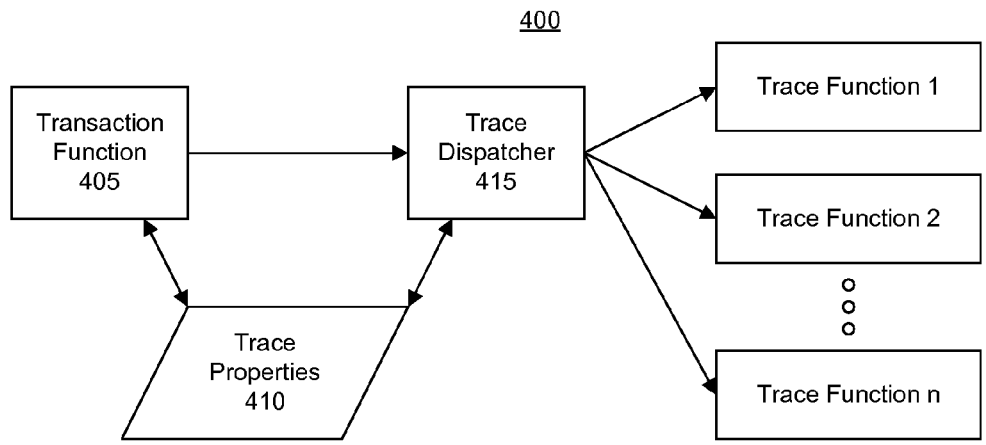

Transaction_for_Verilog_net_N(netProps, newValue, ...)
{
        if (newValue == netProps.value)
                return;

tp = netProps.traceProps;
        bm = tp.preassignBitmap;
        if (tp != null && bm != 0)
                newValue = traceDispatcher.traceVlogNet(bm, tp, tp.net_id,
                        netProps.value, newValue,...);

netProps.value = newValue;

eventQueue.schedule(ExecuteFnA);
eventQueue.schedule(ExecuteFnB);
eventQueue.schedule(ExecuteFnC);
}
```

```
traceVlogNet(bitmap, traceProps, firstScalarId, oldValue, newValue, value,...)
{
        value = newValue;
        index = 0;
        for (index = 0; bitmap != 0; bitmap >>= 1, ++index) {
                if ((bitmap & 1) == 0)
                        continue;
                objectIndex = .objectMapFeatureIndexes[index];
                object = null;
                if (objectIndex >= 0 && traceProps.objectMap != null)
                        object = traceProps.objectMap[objectIndex];
                trace Feature = .bitmapFeatures[index];
                value = traceFeature.traceVlogNet(object, firstScalarId, oldValue,
                        value, ...);
        }
        return value;
}
```

FIG. 6

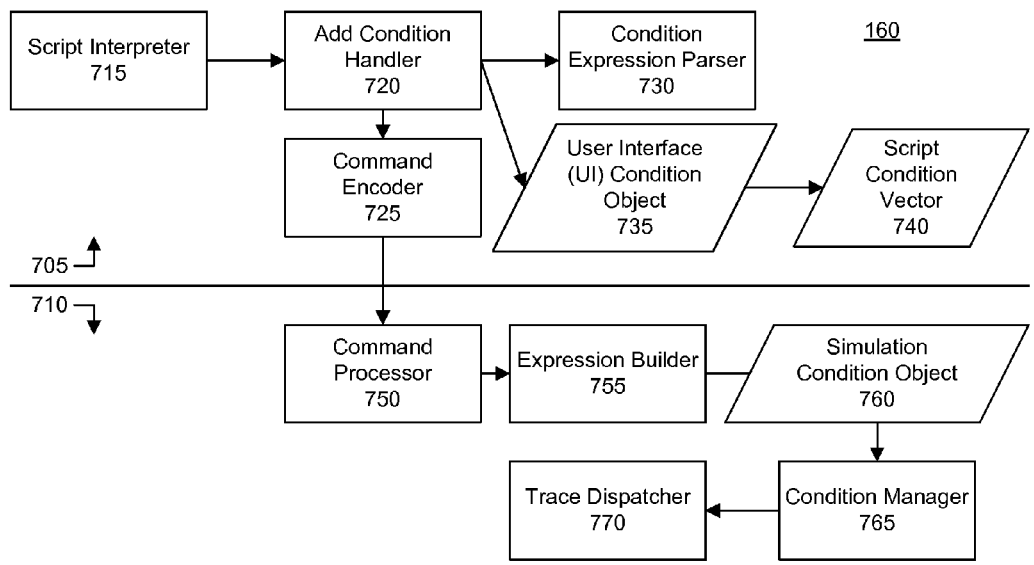

```
processConditions(signal. newValue) {
        if(isinsideScript)
                signal.isModifiedByScript = true;
        else {
                signal.savedValue = signal.value;
                signal.value = newValue;
                for each (condition referencing the signal) {
                        if (condition.evaluate() == true) {
                                isInsideScript = true;
                                runConditionMetScript(condition.id);
                                isInsideScript = false;
                        }
                }
                if (signal.isModifiedByScript) {
                        signal.isModifiedByScript = false;
                        newValue = signal.value;
                }
                signal.value = signal.savedValue;
        } return newValue;
}
```

FIG. 10

HARDWARE DESCRIPTION LANGUAGE SIMULATOR TRACING AND CONTROL

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more embodiments disclosed within this specification relate to simulation of a circuit design and, more particularly, to simulation of a circuit design specified in a hardware description language.

BACKGROUND

A hardware description language (HDL) refers to a computer-language that facilitates the documentation, design, and manufacturing of a digital system, such as an integrated circuit. An HDL combines program verification techniques with expert system design methodologies. Using an HDL, for example, a user can design and specify an electronic circuit, describe the operation of the circuit, and create tests to verify operation of the circuit. In general, an HDL includes standard, text-based expressions of the spatial and temporal structure and behavior of the electronic system being modeled. HDL syntax and semantics include explicit notations for expressing concurrency. In contrast to most software programming languages, an HDL also includes an explicit notion of time, which is a primary attribute of a digital system.

An HDL simulator refers to a program that can simulate operation of a circuit design that is specified in an HDL. An HDL simulator allows a user to simulate operation of the circuit design. Simulated operation of the circuit design in this form facilitates design verification in which the user is able to compare the intended functionality of the circuit design with the HDL implementation of the circuit design.

SUMMARY

One or more embodiments disclosed within this specification relate to simulation of a circuit design and, more particularly, to simulation of a circuit design specified in a hardware description language (HDL).

An embodiment can include a method of processing a circuit design specified in an HDL. The method can include, for each of a plurality of nets of the circuit design, creating a trace memory structure, using a processor, during compilation of the HDL circuit design. Each trace memory structure can include trace properties indicating whether tracing is active for the net. The method also can include generating a transaction function during compilation for each net. The transaction function can be configured to invoke tracing for each net during simulation of the circuit design according to an evaluation of the trace properties for the net.

Another embodiment can include a method of simulating a circuit design specified using an HDL. The method can include, within a transaction function for the net that updates a value of the net during simulation of the circuit design, determining whether the value for the net has changed, responsive to determining that the value has changed, determining whether tracing is active for the net, and responsive to determining that tracing is active for the net, providing an old value of the net, a new value for the net, and an identifier for the net to a trace dispatcher. Each trace function that is active for the net can be invoked using a processor.

Another embodiment can include a non-transitory storage medium having a data structure encoded thereon. The data structure can include a net identifier uniquely specifying a net of a circuit design and a trace bitmap including one bit for each trace function that is available for the net during a simulation of the circuit design.

BRIEF DESCRIPTION OF THE DRAWINGS

FIG. 4 is a block diagram illustrating an example of a simulation architecture in accordance with another embodiment disclosed within this specification.

FIG. 5 is an example of a transaction function in accordance with another embodiment disclosed within this specification.

FIG. 6 is an example of a trace dispatcher in accordance with another embodiment disclosed within this specification.

FIG. 7 is a block flow diagram illustrating the assignment of a condition command in accordance with another embodiment disclosed within this specification.

FIG. 10 illustrates exemplary pseudo-code illustrating reentrant processing in accordance with another embodiment disclosed within this specification.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to the simulation of a circuit design and, more particularly, to simulating a circuit design specified in a hardware description language (HDL). In accordance with the inventive arrangements disclosed within this specification, a circuit design specified using an HDL can be simulated. The simulation architecture provides a trace and user interface infrastructure that supports extensive trace functionality while also providing increased user control over the simulation process.

Figure 1:
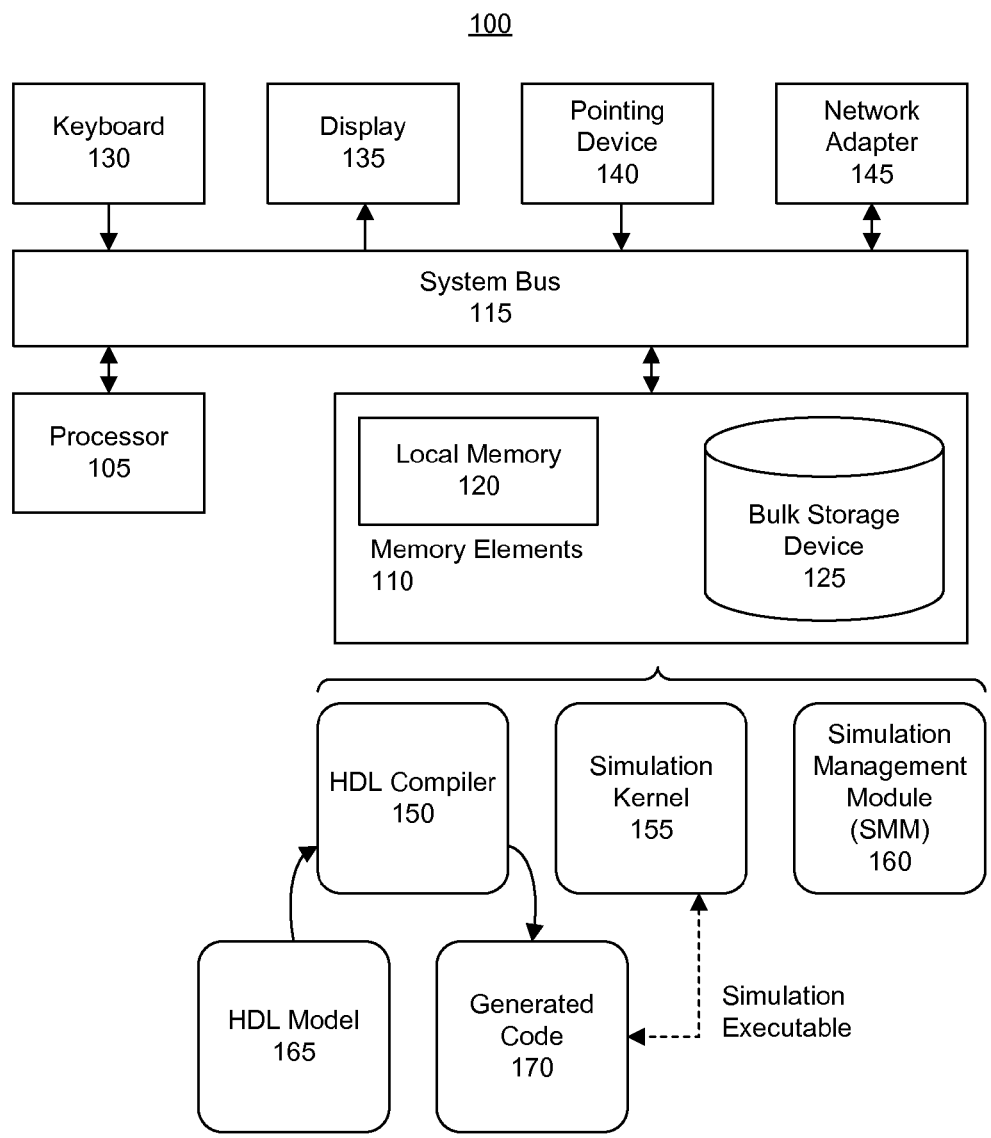
FIG. 1 is a block diagram illustrating an example of a simulation system in accordance with an embodiment disclosed within this specification.

FIG. 1 is a block diagram illustrating an example of a simulation system (system) 100 in accordance with an embodiment disclosed within this specification. As pictured, system 100 can include at least one processor 105 coupled to memory elements 110 through a system bus 115 or other suitable circuitry. As such, system 100 can store program code within memory elements 110. Processor 105 can execute the program code accessed from memory elements 110 via system bus 115. In one aspect, for example, system 100 can be implemented as a computer system or other data processing system that is suitable for storing and/or executing program code. It should be appreciated, however, that system 100 can be implemented in the form of any system that includes a processor and memory and that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device 140 optionally can be coupled to system 100. The I/O devices can be coupled to system 100 either directly or through intervening I/O controllers (not shown). A network adapter 145 also can be coupled to system 100 to enable system 100 to become coupled to other systems, computer systems, remote printers, and/or remote storage devices through intervening private or public networks. Modems, cable modems, and Ethernet cards are examples of different types of network adapter 145 that can be used with system 100.

As illustrated, memory elements 110 can include an HDL compiler 150, a simulation kernel 155, and a simulation management module 160. In general, HDL compiler 150 can receive HDL model 165 and compile, e.g., translate, HDL model 165 into generated code 170. HDL model 165 is a programmatic, e.g., an HDL, representation of a circuit design. Generated code 170 is a representation of the circuit design that, unlike HDL, can be executed by a data processing system such as system 100. For example, while HDL model 165 is specified in an HDL, generated code 170 can be specified in a different high-level language, e.g., C or the like, that is not specifically intended or designed to model hardware. For example, generated code 170 does not include an explicit notion of time as does HDL model 165.

Simulation kernel 155 can be implemented as a library of one or more executable functions that can be installed on system 100 as part of a simulation environment. Simulation kernel 155, for example, can include utilities such as a time-managing event queue, simulation run control providing access to the operating system file system of system 100, and/or value-processing functions. In one aspect, the compiled version of HDL model 165, i.e., generated code 170, and simulation kernel 155 can be linked together during the compilation process implemented by HDL compiler 150 in a machine executable that can be referred to as the "simulation executable."

Simulation management module (SMM) 160 can implement a user interface through which a user can interact with the simulation environment during runtime, e.g., after compilation and during simulation of the circuit design. In this regard, SMM 160 can be configured to present a user interface to users utilizing system 100 during simulation time. SMM 160 can include, for example, a graphical user interface for managing functions of simulation kernel 155 during runtime. In another aspect, SMM 160 can include a command-line shell that allows users to provide commands to simulation kernel 155 during runtime.

For purposes of illustration and explanation, the term "runtime" is used to refer to the time at or during which a circuit design is simulated. "Runtime" can be used interchangeably with the phrase "simulation time" and "during simulation." Runtime (simulation time) is to be distinguished from "compile time." "Compile time" refers to the time at or during which operations performed by HDL compiler 150 are implemented in processing HDL model 165 to produce generated code 170. Thus, runtime refers to the time period after the simulation executable is generated and executed for purposes of simulating the circuit design.

Generated code 170, being the compiled or translated version of HDL model 165 that is executable, can include a variety of different types of functions each created by HDL compiler 150. In one aspect, generated code 170 can include two different function types. A first type of function can be an "execute function" that refers to portions of HDL model 165 that are translated into executable functions. An execute function, in general, includes the procedural logic, or a portion thereof, of HDL model 165. Value changes, for example, assignments to variables, occur directly within execute functions.

A second type of function can be a "transaction function." Each net of the circuit design, for example, can be assigned a value within a transaction function. In general, each net of the circuit design, as represented within generated code 170, can include a transaction function, e.g., one transaction function. In general, each transaction function for a net can be configured to perform the actual assignment of a new value to the net. In addition, each transaction function for a given net is configured to notify a set of one or more executable functions that are dependent upon the net that an assignment of a value has occurred for the net. As used within this specification, the term "net" can refer to a Verilog net and variable, a VHDL signal value, or another equivalent or like object of an HDL. The terms "net" and "signal" are used interchangeably from time-to-time within this specification.

Figure 2:
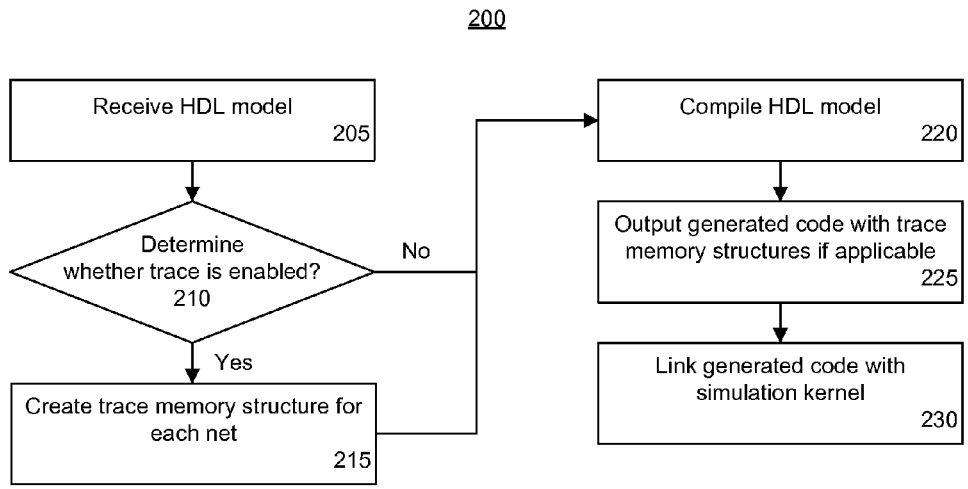
FIG. 2 is a flow chart illustrating a method of compiling a hardware description language model in accordance with another embodiment disclosed within this specification.

FIG. 2 is a flow chart illustrating a method 200 of compiling an HDL model in accordance with another embodiment disclosed within this specification. Method 200 can be implemented using a system such as system 100 of FIG. 1. Method 200 can begin in a state in which a system includes an HDL compiler executing therein.

In block 205, the system can receive an HDL model. For example, a user can open, or import, an HDL model or otherwise identify the particular HDL model to be processed to the system. In block 210, the system can determine whether tracing is enabled. For example, the HDL compiler can include a setting that a user can either toggle on or off. When enabled, the HDL compiler can generate various structures within the generated code that facilitate, e.g., enable, tracing at runtime. When not enabled, the particular structures used to facilitate tracing at runtime are not created. Excluding the tracing structures, e.g., omitting trace memory structures and eliminating particular program code from the generated transaction functions, results in more efficient generated code, but precludes the ability of a user to request tracing during a simulation for one or more nets of the circuit design.

Responsive to the system determining that tracing is enabled, method 200 can proceed to block 215. In block 215, the system can create a trace memory structure for each net of the HDL model. In general, each trace memory structure is a portion of memory reserved for each net that can be used to specify trace properties that can be checked during runtime. The values stored within the trace memory structure of each net can be changed at, or during, runtime to allow a user to select any of the nets of the circuit design for tracing.

Responsive to the system determining that tracing is not enabled, method 200 can proceed directly to block 220. In block 220, the system can compile the HDL model. The system can translate the HDL model into generated code as described with reference to FIG. 1. For example, a transaction function can be generated for each net. The transaction function can be generated to invoke tracing for each net when tracing is enabled. It should be appreciated that the generated code, apart from the trace memory structures, can differ in other respects depending upon whether tracing is enabled. For example, particular program code included in each transaction function for purposes of implementing tracing functions can be omitted from each transaction function during compilation when tracing is not enabled to further streamline the generated code.

In block 225, the system can output the generated code. If tracing is enabled, the generated code is output with the trace memory structures for each net. Further, the transaction function for each net includes program code that facilitates tracing functionality as described in greater detail within this specification. In block 230, the system can link the generated code with the simulation kernel to form the simulation executable. Upon completion of method 200, the circuit design can be simulated.

Figure 3:
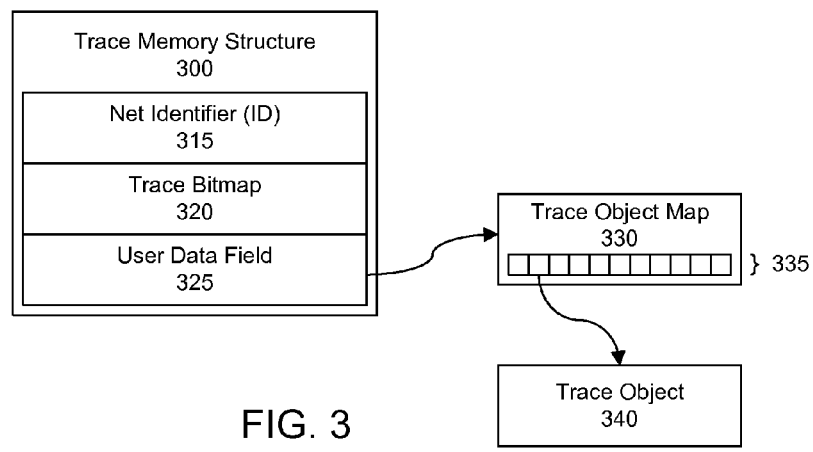
FIG. 3 is a block diagram illustrating an example of a trace memory structure in accordance with another embodiment disclosed within this specification.

FIG. 3 is a block diagram illustrating an example of a trace memory structure 300 in accordance with another embodiment disclosed within this specification. One instance of trace memory structure 300, as noted, can be created, or defined, for each net of the circuit design by the HDL compiler when tracing is enabled. Thus, each net has, or is associated with, one trace memory structure that can be used to specify the trace functions that are active for the net within the simulation executable (and as such within the simulation). It should be appreciated that once trace memory structure 300 is created and available during runtime, values stored within trace memory structure 300 can be modified via user input through SMM 160 of FIG. 1 prior to or during the simulation.

In general, trace memory structure 300 can include, or specify, one or more trace properties. Trace memory structure 300 can include a net identifier (ID) 315, a trace bitmap 320, and a user data field 325. From time to time within this specification, net ID 315, trace bitmap 320, and user data field 325 may be referred to individually as a "trace property" or collectively as "trace properties." Net ID 315 is a unique identifier that is correlated with the particular net to which trace memory structure 300 corresponds or with which trace memory structure 300 is associated.

Trace bitmap 320 can be implemented as a plurality of single bit flags, where each bit (or flag) corresponds to one trace function available for the net. As such, each flag indicates whether the corresponding trace function is active, e.g., has been turned on, for the net indicated by net ID 315. When a particular flag is set, the trace function corresponding to that flag is active for the net. Each flag, and thus, each trace function, can be turned on or off independently of the others via user input received through SMM 160 of FIG. 1 at or during runtime of the simulation.

In one example, trace bitmap 320 can be specified in the form of a 32 bit word, thereby allowing up to 32 different trace functions to be separately activated via the corresponding flag of trace bitmap 320. A set flag within trace bitmap 315 indicates that the trace function associated with that flag location in the word is active. A clear flag within trace bitmap 320 indicates that the trace function associated with that flag location is not active. Accordingly, when a particular flag of trace bitmap 320 is set, a trace handler for that trace function is called prior to updating the value of the net in net value 310.

Examples of trace functions that can be activated by setting a corresponding flag for a net can include, but are not limited to, monitoring a net, recording transactions on the net to one or more different file formats, performing intrusive value changing operations, and allowing external control and monitoring of a simulation through a programming interface, e.g., SMM 160. Exemplary file types to which values can be output or written from trace functions can include database files having an extension of "WDB", Value Change Dump files having an extension of "VCD", and Switching Activity Interchange Format files having an extension of "SAIF".

Examples of intrusive value changing operations can include a "force" command and a "condition" command. The force command and the condition command each can be implemented via SMM 160 to be described in greater detail within this specification. In general, the force command refers to a mechanism that allows a user to override the waveform of a net with a waveform that the user defines during or at simulation. The condition command refers to a mechanism that allows a logical expression involving nets and the values of the nets to be defined and registered at or during simulation along with a script (e.g., a Tcl script). During simulation, when the expression evaluates to true, the script can be invoked.

User data field 325 can be used to store a pointer to a trace object map 330. Trace object map 330 can include a plurality of trace object pointers 335. Each trace object pointer 335 within trace object map 330 can be a pointer to a kernel-side, net-specific, object, referred to as trace object 340, for a specific, active trace function. For example, a trace object pointer 335 can point to trace object 340 that is specific to the combination of (1) the net specified by net ID 315 and (2) a specific trace function. Thus, each trace object pointer 335 can point to its own, e.g., a different, trace object 340.

In illustration, a particular trace function, e.g., a "force" trace function, can maintain a list of "force" trace objects. Each force trace object can maintain the state of a forced waveform for a single net that is being forced to a particular value via the force trace function. For a particular net "N," being forced, where "N" is a value uniquely specifying a particular net, one of the force trace pointers points to a force trace object for net N. In further illustration, a different trace function that is active for net N, e.g., one that simply writes the value of net N to a file, may not utilize a trace object (e.g., a force trace object as in the prior example). As such, the trace function would not require a trace object pointer 335 in trace object map 330. Accordingly, the particular index of a trace function in trace bitmap 320 (e.g., the position of the flag in trace bitmap 320) need not be the same as the index (position) of the trace object pointer 335 within trace object map 330 since each trace function does not have a corresponding trace object pointer 335 or trace object 340.

FIG. 4 is a block diagram illustrating an example of a simulation architecture in accordance with another embodiment disclosed within this specification. Runtime architecture 400 can be implemented within a system such as system 100 at runtime, e.g., during simulation. Runtime architecture 400 illustrates the processing and implementation of trace functions for a particular net during runtime.

As shown, runtime architecture 400 includes a transaction function 405, trace properties 410, a trace dispatcher 415, and a plurality of trace functions 1-n, where "n" is an integer value from 1 to 32 in this example. As noted, each net can include a transaction function and trace properties specific to the net. Thus, transaction function 405 and trace properties 410 correspond to the particular net that is being updated during simulation. Trace properties 410 can be specified within the trace data structure in existence for the net. Trace dispatcher 415 can represent a module that can be called by transaction function 405 for the net to invoke appropriate trace functions active for the net as described. Thus, while transaction function 405 and trace properties 410 are net specific, trace dispatcher 415 is not.

Transaction function 405 can begin the trace process for a net. Transaction function 405, for example, can check trace properties 410 for the net to determine whether tracing is active for the net based upon whether any individual trace functions are active for the net. When at least one trace function is active, e.g., a flag is set within trace properties 410, transaction function 405 can send the change in the value for the net to trace dispatcher 415. When no trace functions are active, e.g., no flags are set, transaction function 405 need not call or interact with trace dispatcher 415.

Trace dispatcher 415, responsive to receiving the change in value for the net, can check trace properties 410 for the net to determine which trace functions are active. Trace dispatcher 415 can send the value change for the net to each of the trace functions that are determined to be active for the net. Thus, only those trace functions that are active, e.g., having a set flag in trace properties 410, for the net receive the value change for the net from trace dispatcher 415.

FIG. 5 is an example of a transaction function in accordance with another embodiment disclosed within this specification. FIG. 5 illustrates an exemplary pseudo-code implementation of a transaction function 500 for a net. Trace logic is included within the pseudo-code of the transaction function shown in FIG. 5. It should be appreciated that various aspects of transaction function 500 that are not pertinent to tracing have been omitted. In other aspects, for purposes of clarity, the multi-level call structures that can be utilized or included within transaction function 500 have been flattened as if the transaction function itself performs the various operations illustrated. Accordingly, FIG. 5 is presented for purposes of illustration only and the one or more embodiments disclosed within this specification are not intended to be limited by the example presented.

During compilation, the HDL compiler generates a transaction function for each net of the circuit design. As illustrated, transaction function 500 can check the trace bitmap for the net to determine whether any flag is set. Transaction function further 500 can invoke the trace dispatcher when at least one bit is set. As discussed, the trace dispatcher can determine, from the trace bitmap, which of the trace functions the value change for the net should be provided.

Transaction function 500 first checks to see whether the new value for the net is different from the old value. When the new value is not different form the old value, transaction function 500 returns without any further processing. When the new value is different from the old value, transaction function 500 continues. Presuming that tracing was enabled during compilation, transaction function 500 checks the trace properties for the net. As discussed, when tracing is not enabled during compilation, program code for checking trace properties and for invoking the trace dispatcher can be omitted from transaction function 500 and each other transaction function.

In one aspect, transaction function 500 can check all flags of the trace bitmap in the trace memory structure for the net simultaneously, e.g., using a word compare instruction or the like. This facilitates more efficient checking of whether trace functions are active as the determination of whether any trace functions are active requires only a single instruction. When any of the flags for the net are set within the trace properties, transaction function 500 can dispatch the value change, including the original value of the net, to the trace dispatcher (traceDispatcher). In the example shown in FIG. 5, tp.net_id, which can be net ID 315 of FIG. 3, can be passed to the trace dispatcher also.

Accordingly, transaction function 500 provides every trace function an opportunity to modify the new value for the net. Each trace function can perform operations other than record value changes. Each trace function can, for example, alter the way in which the simulation of the circuit design progresses or executes. The "force" and the "condition" commands are two examples of such features. While some simulation environments implement script related functionality by creating the processes at runtime and making the processes sensitive to particular nets at runtime, the two commands illustrated can be implemented as trace functions that react to value changes on a net from within the transaction function for the net.

After dispatching to the trace functions, the value of the net is updated, potentially with a new value as determined by the trace functions that are active. After the trace dispatching is complete (along with other functionality not illustrated in this example), transaction function 500 triggers the various execute functions specified at the end of transaction function 500. Each execute function, as noted, is a function that is waiting, e.g., dependent upon, the net. In the example shown in FIG. 5, there are three execute functions shown to represent the hard-coded list of dependent execute functions determined at compile time by the HDL compiler and included within transaction function 500 for the net. Each execute function listed in transaction function 500 is dependent upon the net to which transaction function 500 corresponds. Transaction function 500 interacts with the simulation kernel, for example, to schedule the various execution events within the event queue of the simulation as managed by the simulation kernel.

FIG. 6 is an example of a trace dispatcher in accordance with another embodiment disclosed within this specification. FIG. 6 illustrates an exemplary pseudo-code implementation of a trace dispatcher 600. As FIG. 6 is presented for purposes of illustration only, the one or more embodiments disclosed within this specification are not intended to be limited by the example presented.

Trace dispatcher 600 can be implemented as a traceDispatcher class that implements the top-level trace handler, holds references to the manager classes for each trace feature, and provides basic trace services to the manager classes for turning on and off, e.g., activating or deactivating, trace functions for nets (and variables). Trace dispatcher 600 further can dispatch value updates to the trace handler functions (traceFeature.traceVlogNet) of the various manager classes.

Trace dispatcher 600 can initialize a temporary variable called "value." The temporary variable is initialized with the new value of the net. The temporary variable can be sent to, and possibly modified by, each trace function that is active for a net in turn as the new value to use for the net value change. The dispatcher can begin calling trace functions starting at the first function having index zero (0). In one aspect, those trace functions that are used more frequently can be assigned beginning or lower indices than those trace functions used less frequently. The most popular trace function, for example, would be assigned an index of zero, while the second most popular trace function can be assigned an index of one, etc., to facilitate greater efficiency.

Trace dispatcher 600 can loop over the trace bitmap for the net, shifting the trace bitmap right one bit at a time until the trace bitmap has no further set bits. This strategy allows the trace function checking to exit early when the last trace function has been processed. Inside the loop, if the least significant bit is reset, the trace feature is off for the net. Accordingly, the trace dispatcher skips processing for that trace function.

From the user data field, e.g., user data field 325 of FIG. 3, of the trace properties, trace function 600 obtains the position within the trace object map of the trace object pointer for the current trace function. If the trace function uses trace objects, the trace object for the current trace function for the net is fetched. A manager object for the current trace function is fetched from an array of manager objects. Trace function 600 of the manager object is invoked with the trace object, old and (possibly modified) new values of the net, and any other parameters that may be required. Trace function 600 of the manager object returns the value to use as the "new value" for the net. If the manager object does not modify the value, trace function 600 for the manager object returns the same new value that was initially received by trace function 600.

FIG. 7 is a block flow diagram illustrating the assignment of a condition command in accordance with another embodiment disclosed within this specification. A condition command allows a particular script to be executed or run responsive to a value change for a net. FIG. 7 illustrates a runtime architecture that can be implemented within a system such as system 100 of FIG. 1 during simulation that allows a user to define a condition command. Thus, during runtime, e.g., simulation of a circuit design, the user can, post compilation, define a condition in association with the simulation.

FIG. 7 illustrates two independent processes executing concurrently. Each entity illustrated above the horizontal line is an entity executing in process 705, which is a user interface process. For example, entities above the line can be a part of SMM 160 of FIG. 1. Each entity illustrated below the horizontal line is an entity executing in process 710, which is a simulation (e.g., simulation executable) process. For example, entities below the line can be part of the simulation executable. Processes 705 and 710 are separate and independent.

The architecture illustrated in FIG. 7 allows processes 705 and 710 to communicate with one another to implement a condition on the simulation at the request of a user received via SMM 160. In one aspect, inter-process communication between process 705 and 710 can be performed using a protocol such as a text-based communication protocol. For example, the communication protocol can be the protocol utilized by the GNU Project debugger, which can be augmented to support simulation functions.

As shown, SMM 160 executing within process 705 can include a script interpreter 715, an add condition handler 720, a command encoder 725, and a condition expression parser 730. The simulation executable executing within process 710 can include a command processor 750, an expression builder 755, a condition manager 765, and a trace dispatcher 770.

In operation, a user can input, e.g., type, an add_condition command at a command prompt of a script interface provided by SMM 160. For purposes of illustration, the script language can be Tcl, though any of a variety of scripting languages can be used. The exemplary use of Tcl is not intended to limit the one or more embodiments disclosed within this specification.

For example, the user can enter an add_condition command in the form of "add_condition {clk==1 && data !=0000} {stop; report_value data}". Responsive to a user entering the add_condition command into the script interface, script interpreter 715 can forward a request to add a condition to add condition handler 720. The request can include a condition expression that enumerates the particular conditions upon which the condition-met script will execute. Add condition handler 720, responsive to the request, calls condition expression parser 730, which processes the condition expression from the request. Condition expression parser 730 can convert the condition into one or more tokens such as: "clk", "==", "1", "&&", "data", "!=", and "0000". Condition expression parser 730, for example, can form a parse tree using a recursive descent parser. Examples of operators that can be supported by the architecture illustrated in FIG. 7 can include "&&" for logical AND, "||" for logical OR, "==" for equality, and "!=" for inequality. An expression also can be a signal (net) by itself, which means that any change to that signal evaluates to true. Condition expression parser 730 can transform the tree into a postfix list such as: "clk, 1, ==, data, 0000, &&".

Add condition handler 720 creates a record of the request referred to as user interface (UI) condition object 735. UI condition object 735 includes an ID that is unique among the IDs created for all UI condition objects. The ID of UI condition object 735 can be used to coordinate with corresponding operations taking place in process 710 to be described herein in greater detail.

Add condition hander 720 further stores UI condition object 735 within a collection of UI condition objects called script condition vector 740. UI condition object IDs can be used to look-up and retrieve particular ones of the UI condition objects stored within script condition vector 740.

Command Encoder 725 can transform the signals specified in the add_condition command into HDL Value Objects. HDL value objects are data structures needed by process 710 to find the signal referenced by the add_condition command within the simulation memory. Command encoder 725, for example, can transform the values specified in human-readable text format, e.g., the script form of the add_condition command illustrated above, into raw binary format upon which the simulation can operate directly.

In one aspect, since the protocol used to exchange data between process 705 and 710 is text-based, raw binary values can be converted to Base64 for transmission and reconstructed as binary in process 710. Command encoder 725 can add additional fields as part of the communication protocol between the two processes. An example of a command that can be passed from command encoder 725 within process 705 to command processor 750 within process 710 can be the following:

1-condition-add -hdlValueObject 0 0 1968 0 1 11976-value "AQAAAAAAAAA="-operator==-hdlValueObject 0 0 1776 0 1 1784-value "AAAAAAAAAAA="-operator==-operator &&

Within the example illustrated above, each "-hdlValueObject" and following words equate back to a signal from the expression, e.g., "clk". Each "-value" and following Base64 string equates to a literal value. Each "-operator" and following token equates to an operator. Though not explicitly illustrated, it should be appreciated that the ID created by add condition handler 720 for the add_condition command also can be passed from command encoder 725 to command processor 750 as part of the command.

Within process 710, command processor 750 can receive the command as sent from command encoder 725. Command processor 750 can send the received command to expression builder 755. Expression builder 755 can reconstruct the flattened, postfix condition expression into a tree, which is represented as simulation condition object 760. Simulation condition object 760 can specify the particular condition expression to be evaluated for the net. Expression builder 755 sends simulation condition object 760 to condition manager 765. Condition manager 765 saves simulation condition object 760. Condition manager 765 also saves the ID assigned by add condition handler 720 in process 705 in association with simulation condition object 760, thereby establishing a link between simulation condition object 760 in process 710 and UI condition object 735 in process 705.

Condition manager 765 can store or maintain the set of active conditions in the form of simulation condition objects for the simulation. Condition manager 765 further stores or maintains the connecting signal value changes to condition evaluation. Storing the connecting signal value changes provides an optimization of the simulation in that repeated memory allocations due to reentering condition manager 765, to be described in greater detail herein, can be avoided. In general, when condition manager 765 is reentered, rather than allocating new memory upon reentering, memory allocated in an earlier invocation of condition manager 765 can be reused. Further description of the optimization described is provided with reference to FIG. 10 of this specification.

During the set-up phase, condition manager 765 is responsible for registering interest in all the signals referenced in a simulation condition object's condition expression tree. Condition manager 765 can register interest through trace dispatcher 770, which is responsible for keeping track of interest in individual signals. Condition manager 765, for example, informs trace dispatcher 770 whether to trace particular signals or not. For example, condition manager 765 can instruct trace dispatcher 770 to update trace properties, e.g., set flags, corresponding to trace functions (e.g., the condition trace function) to be activated for selected nets.

Figure 8:
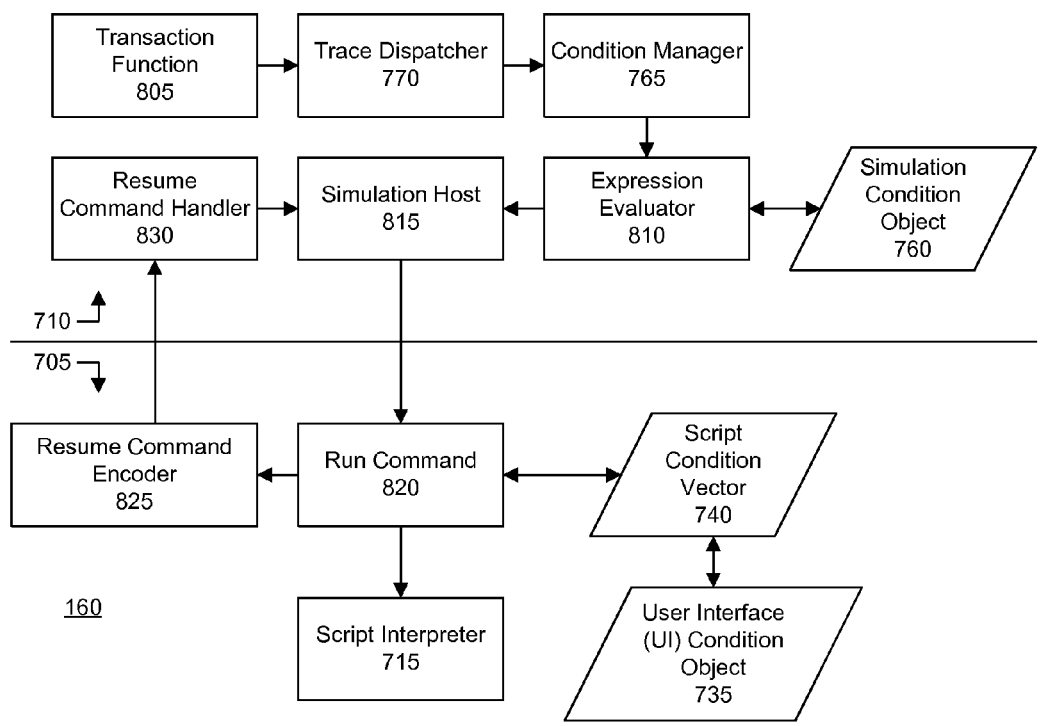
FIG. 8 is a block flow diagram illustrating the execution of a condition command in accordance with another embodiment disclosed within this specification.

FIG. 8 is a block flow diagram illustrating the execution of a condition command in accordance with another embodiment disclosed within this specification. As noted, a condition command allows a particular script to be executed or run responsive to a condition being met, e.g., a value change for a net. FIG. 8 illustrates a runtime architecture that can be implemented within a system such as system 100 of FIG. 1 at runtime that executes a condition that is set as illustrated with respect to FIG. 7.

FIG. 8 illustrates processes 705 and 710 executing concurrently as separate and independent processes. In FIG. 8, process 705 is now located below the line, while process 710 is located above the line. Each entity illustrated below the horizontal line is an entity executing in process 705, which is a user interface process. For example, entities below the line can be a part of SMM 160 of FIG. 1. Each entity illustrated above the horizontal line is an entity executing in process 710, which is a simulation (e.g., simulation executable) process. For example, entities above the line can be part of the simulation executable.

When a run command is in progress (e.g., a simulation is running), transaction function 805 can notify trace dispatcher 770 whenever the value for a net of interest changes. As discussed, a transaction function, in general, handles changes to net values. Trace dispatcher 770 can determine that condition manager 765 has a registered interest in the particular net that has changed value (e.g., via the trace function flags) and, in response thereto, forward a value change notification to condition manager 765 for the signal of interest.

For each simulation condition object 760 that references the changed net, condition manager 765 calls expression evaluator 810 to evaluate the condition expression in simulation condition object 760. For example, in the above example where "clk" is the signal that has just changed, expression evaluator 810 can determine whether "clk" is 1 and also whether "data" is not "0000".

When the condition expression of simulation condition object 760 evaluates to true, expression evaluator 810 notifies simulation host 815. Simulation host 815 can manage the runtime simulation and control operations such as starting, stopping, and suspending of the runtime simulation. In the case of the condition expression evaluating to true, simulation host 815 suspends the run of the simulation due a condition-met event, e.g., the condition expression evaluating to true. Thus, the simulation executing within process 710 is suspended or placed in a suspended state. In the suspended state, simulation host 815 ensures that the context of the simulation at the stopping point of the most recent run command for the simulation is preserved, e.g., stored, in order to resume at a later time.

Simulation host 815 notifies process 705 corresponding to the user interface of the condition-met event. Simulation host 815 can notify process 705 using the inter-process communication protocol previously described. In doing so, simulation host 815 can pass the ID of simulation condition object 760 that evaluated to true to run command 820. Script interpreter 715, for example, can be waiting for a notification of some kind. In the example described with reference to FIG. 8, script interpreter 715 is blocked inside of a run command (e.g., illustrated as run command 820). When run command 820 receives notification of the condition-met event, run command 820 uses the ID of simulation condition object 760 passed from simulation host 815 to look-up UI condition object 735 corresponding thereto from script condition vector 740.

The condition-met script, e.g., the script to be executed when the condition expression evaluates to true is fetched from UI condition object 735 and sent to script interpreter 715 for execution. In the example illustrated in FIG. 8, the condition-met script does not invoke a stop command. Upon completion of the condition-met script, run command 820 sends a "resume" command to resume command encoder 825. Resume command encoder 825 sends the resume command through the inter-process communication protocol previously described to resume command handler 830. Resume command handler 830 instructs simulation host 815 to continue the run command that was previously suspended from the saved context.

Within the user interface, concurrently with the processing performed within process 710, submission of the resume command can complete and the run command can return to waiting for another run status event.

Figure 9:
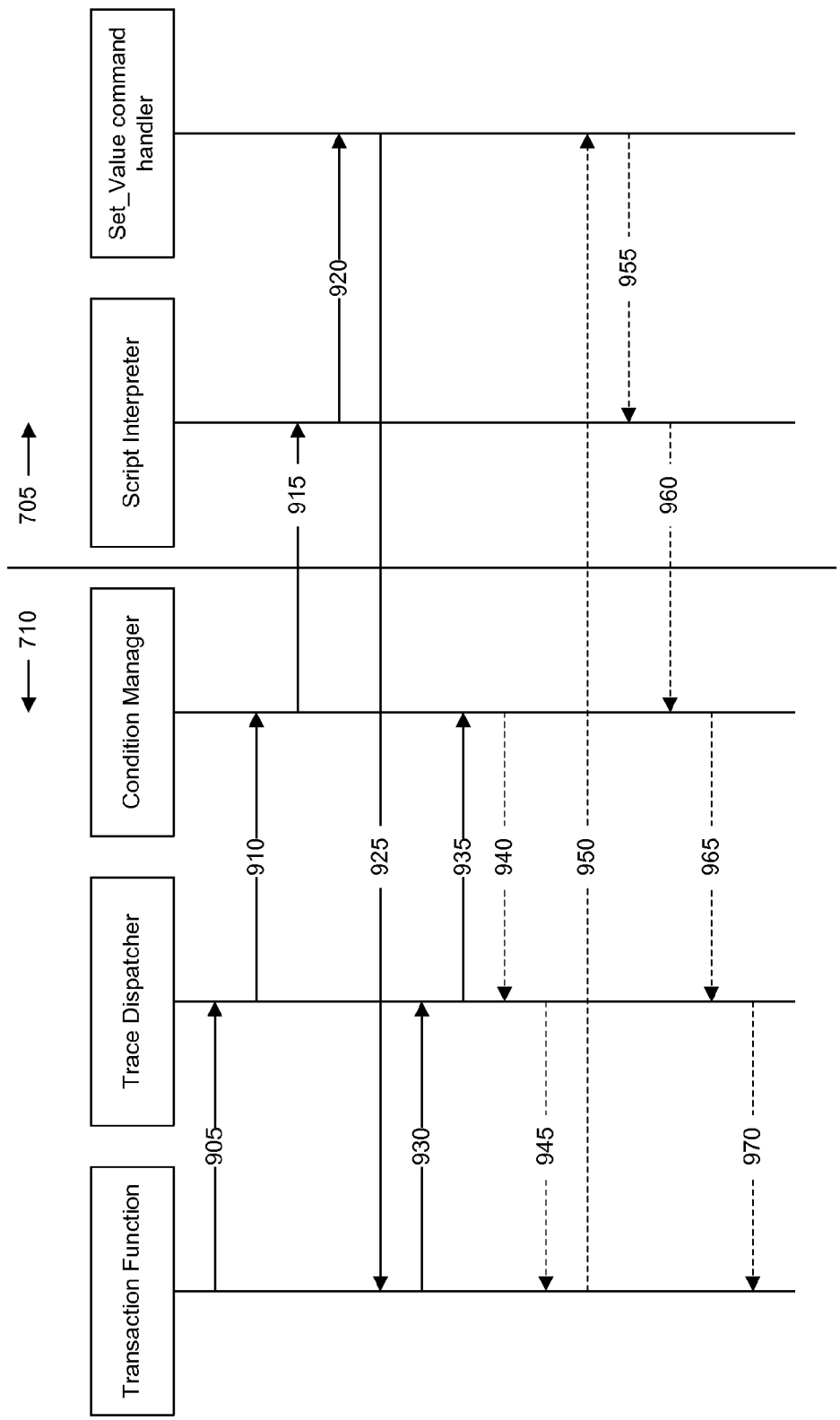
FIG. 9 is a signaling diagram illustrating an example of condition-met processing in accordance with another embodiment disclosed within this specification.

FIG. 9 is a signaling diagram illustrating an example of condition-met processing in accordance with another embodiment disclosed within this specification. FIG. 9 illustrates a technique for changing the value of the triggering signal in the condition-met script. In accordance with one or more embodiments disclosed within this specification, a change to the signal (net) that caused a condition to become true can be scripted.

In illustration, consider an exemplary condition command such as "add_condition {count==1010} {set_value count 0000}". The condition command includes two arguments. The first argument defines the particular condition to be observed. The second argument is the condition-met script to be executed upon observance of the stated condition. The exemplary condition command states that every time the count becomes 1010, set the count to 0000. The condition-met script corresponds is "set_value count 0000". The original value of the count, in this case 1010, which triggered the condition-met script, is not permitted to carry through to the HDL processes executing within the simulation. For example, if "count" had changed from 1001 to 1010, the condition-met script ensures that no HDL process is ever provided the 1010 value for count. Because conditions are processed from inside the transaction functions, and because the set_value command itself operates through the same transaction function, a special mechanism is employed to handle what is referred to as a re-entrant situation.

FIG. 9 illustrates reentrancy for a condition-met script in which the signal that triggered the condition is modified. Within FIG. 9, the boxes labeled along the top portion correspond to modules or entities executing within a system during simulation. Each solid horizontal line indicates a call from one entity to another in the direction of the arrow. Each dashed horizontal line indicates a return from a call in the direction of the arrow. The vertical line between the condition manager and the script interpreter indicates the division between process 705 and 710.

As illustrated, a transaction function for a particular net can implement a call 905 to the trace dispatcher indicating a change to the value of a signal (net) for the transaction function. The trace dispatcher implements a call 910 to the condition manager, which effectively forwards notification 905. When the condition manager is notified of the value change by the trace dispatcher, the new value of the signal, referred to as value 1, has not yet been applied to the signal. Accordingly, the signal, within the simulation, retains the original value, referred to as value 0, at least for the time being.

The condition manager saves the original signal value (value 0) and applies the new value of the signal (value 1) to the signal. As such, the condition expressions can be evaluated properly against value 1, which is the new value. The condition manager, for example, can evaluate a condition expression, determine that the condition expression is true or not, and set a flag or other marker that the condition manager is currently inside of a condition-met script. As such, the condition manager can be configured to initiate a chain of events that cross the process boundary and execute the condition-met script within process 705. For purposes of illustration, one or more of the intermediate processing steps have been omitted.

The condition manager, in general, passes a message 915 to the script interpreter instructing the script interpreter to execute the condition-met script. The condition-met script includes a set_value command, which is executed by the set_value command handler invoked by the script handler via call 920. The set_value command handler, in executing the set_value command, applies a new value, referred to as value 2, to the signal by invoking the transaction function for the signal via call 925.

Responsive to being called, the trace function implements call 930 to the trace dispatcher. The trace dispatcher implements a call 935 to the condition manager. Responsive to being called, the trace manager recognizes that the module has been re-entered due to the earlier set flag or mark. The condition manager marks the signal as having been modified by script and returns 940 to the trace dispatcher, which returns 945 to the transaction function. The transaction function completes the assignment of the value of the signal set by the set_value command to value 2.

After the call stack unwinds, e.g., via returns 950, 955, and 960, to the condition manager, the condition manager clears the marker indicating that the condition manager is no longer within the script. The condition manager further determines that the signal has been modified by script. Accordingly, the condition manager constructs a new value buffer containing the current contents of the signal, i.e., value 2, to be used in place of the value sent to the transaction function, i.e., value 1. The value of the signal is restored the original value (value 0) so that the transaction function value change operation is not corrupted. After returning through the trace dispatcher, e.g., via returns 965 and 970, the transaction function accepts the substituted new value (value 2) to be applied finally to the signal. Had the condition-met script not modified the same signal, the new value buffer would not have been created, the original value (value 0) would have been restored to the signal, and the transaction function would have continued using the first new value (value 1) as if condition processing had not occurred.

FIG. 10 illustrates exemplary pseudo-code illustrating reentrant processing in accordance with another embodiment disclosed within this specification. As shown, the reentrant processing includes the necessary checks to determine whether the value of the signal has been modified by a script, e.g., a condition-met script, or not. Further processing is performed to determine whether the process has been reentered as described.

Referring to FIG. 10, variables that are used include newValue, signal.savedValue, and signal.value. Other variables can be used but are not material to the optimizations described. Appreciably, each variable requires memory to hold the value assigned thereto. The memory for newValue, for example, can be pre-allocated at compile time when the compiler determines that a particular process such as an execute function is specified in HDL to generate a new value for the net. The memory for signal.value also can be pre-allocated at compile time as an intrinsic part of the net itself, as represented in generated code.

The variable signal.savedValue, however, is not pre-allocated at compile time since one does not know whether the net will have a condition placed thereon at compile time. As discussed, conditions can be placed on nets at runtime. Accordingly, memory for signal.savedValue must be allocated at run time. In an alternate embodiment, memory can be allocated inside the function illustrated in FIG. 10 by preceding the line that reads "signal.savedValue=signal.value" with one such, for example, as "signal.savedValue=allocate_mem (sizeof(signal.value))". Similarly, following the statement that reads "signal.value=signal.savedValue", another statement can be added that reads, for example, "free(signal.savedValue)". With such an implementation, every time the algorithm runs, one allocate/free statement pair would be executed thereby consuming additional computing time and reducing efficiency of the resulting system. In another embodiment, as discussed within this specification, the variable signal.savedValue can be allocated one time which occurs at the time the condition is set up. The allocated memory is stored with other condition details thereby avoiding allocation within the function illustrated in FIG. 10.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a computer program product, which comprises all the features enabling the implementation of the methods described herein. The computer program product can include a data storage medium, e.g., a non-transitory computer-usable or computer-readable data storage medium such as a digital storage medium, storing program code that, when loaded and executed in a system including a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various embodiments of the one or more embodiments disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this specification, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of processing a circuit design specified in a hardware description language (HDL), the method comprising:
for each of a plurality of nets of the circuit design, creating a trace memory structure, using a processor, during compilation of the HDL circuit design;
wherein each trace memory structure comprises trace properties indicating whether tracing is active for the net;
generating a transaction function during compilation for each net;
wherein the transaction function is configured to invoke tracing for each net during simulation of the circuit design according to an evaluation of the trace properties for the net;
wherein the trace properties for each net comprise a plurality of flags and each flag indicates whether one of a plurality of different trace functions is active for the net;
and wherein each flag of the trace properties for a net is updatable during runtime of a simulation of the circuit design responsive to a user input.

2. The method of claim 1, wherein the trace memory structure for each net further comprises a net identifier that uniquely specifies the net.

3. The method of claim 2, wherein the trace memory structure for each net further comprises a user data field, wherein the user data field includes a pointer to a trace object map including a plurality of trace object pointers specific to the net.

4. The method of claim 3, wherein a trace object pointer of the plurality of trace object pointers points to a trace object specific to a combination of the net identifier and a particular trace function of the plurality of different trace functions of the net indicated by the net identifier; and
wherein the trace object stores data used in an operation performed by the particular trace function for the net.

5. The method of claim 1, wherein the user input is received from a user interface executing within a first process concurrently with the simulation executing in a second and different process.

* * * * *